United States Patent
Fazzio

(10) Patent No.: US 7,642,642 B2
(45) Date of Patent: Jan. 5, 2010

(54) MICROCAP WAFER BONDING APPARATUS

(75) Inventor: R. Shane Fazzio, Loveland, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 336 days.

(21) Appl. No.: 10/807,417

(22) Filed: Mar. 23, 2004

(65) Prior Publication Data
US 2005/0212117 A1    Sep. 29, 2005

(51) Int. Cl.
H01L 23/12    (2006.01)
(52) U.S. Cl. .................. 257/704; 257/710; 257/E23.18
(58) Field of Classification Search .................. 257/704, 257/710, 781, E23.18
See application file for complete search history.

(56) References Cited

U.S. PATENT DOCUMENTS

| | | | | |
|---|---|---|---|---|
| 6,046,074 | A * | 4/2000 | McHerron et al. | 438/119 |
| 6,459,160 | B1 * | 10/2002 | Goldmann et al. | 257/778 |
| 6,717,052 | B2 * | 4/2004 | Wang et al. | 174/381 |
| 6,770,885 | B2 * | 8/2004 | Eberhard et al. | 250/370.11 |
| 6,787,897 | B2 * | 9/2004 | Geefay et al. | 257/704 |
| 2003/0061693 | A1 * | 4/2003 | Kikushima et al. | 29/25.35 |
| 2003/0062830 | A1 * | 4/2003 | Guenther et al. | 313/512 |
| 2003/0143423 | A1 * | 7/2003 | McCormick et al. | 428/690 |
| 2004/0211966 | A1 * | 10/2004 | Guenther et al. | 257/79 |

OTHER PUBLICATIONS www.m-w.com, Merriam-Webster Online Dictionary.*
Cytop® Amorphous Fluorocarbon Polymer pamphlet by Bellex International Corp., 2 pages total.

* cited by examiner

Primary Examiner—Monica Lewis

(57) ABSTRACT

A method of fabricating an apparatus including a sealed cavity and an apparatus embodying the method are disclosed. To fabricate the apparatus, a device chip including a substrate and at least one circuit element on the substrate is fabricated. Also, a cap is fabricated. Next, the device chip and the cap are bonded such that a sealed cavity is formed by the device chip and the cap. The bond is accomplished using thermo compression technique. Gold or other suitable metal can be used as a bonding agent. Then or at the same time, caulking agent is reflowed over the bonding agent, over portions of the cap, or both to further seal the cavity. In the resultant device, the sealed cavity is sealed by the bonding agent, the caulking agent, or both. The caulking agent increases hermeticity of the cavity and provides for even higher level of protection of the cavity against adverse environmental conditions.

7 Claims, 2 Drawing Sheets

MICROCAP WAFER BONDING APPARATUS

BACKGROUND

The present invention relates to integrated circuit (IC) fabrication technology, and more particularly, to a method of fabricating an IC having a sealed cavity.

Some products use packaging technology that involves bonding a cap over a predetermined area of a substrate to create a hermetically sealed cavity. The hermetically sealed cavity is often formed to protect sensitive circuit elements therein. FIG. 1 is a perspective illustration of a sample apparatus 10 including a device chip 20 having a substrate 22 and circuit elements 24 fabricated on the substrate 22. A cap 30 is attached, via thermo compression bond, over the device chip 20 defining a hermetically sealed cavity within which the circuit elements 24 are protected.

FIG. 2 illustrates a cut-away side view of the apparatus 10 of FIG. 1 after the bonding process. The hermetically sealed cavity is indicated with reference number 26. As illustrated, bottom of the hermetically sealed cavity 26 is defined by the device chip 20 including the substrate 22 and the circuit elements 24. Top of the hermetically sealed cavity 26 is defined by the cap 30. The sizes of the device chip 20 and the cap 30 can vary greatly depending on implementation but can be, for example, on the order of millimeters (mm) or fractions of millimeters, for example, about 0.5 mm to 2 mm.

Sides of the hermetically sealed cavity 26 are defined by gasket 32 which can be a part of the cap 30. The gasket 32 is attached to the substrate 22 using bonding agent 34 such as gold. To achieve the hermetically sealed cavity 26, the bonding agent 34 is applied to the substrate 22, the gasket 32, or both before they are brought together. As for the bonding metal 34, gold (chemical symbol Au) is often used but other materials can be used as the bonding agent. Then, the device chip 20 and the cap 30 are pressed together and heated to effectuate diffusion bonding. The gasket 32 can be about 1 to 10 microns thick depending on implementation. This process results in a hermetic sealing of the cavity 26; however, long-term exposure to harsh environmental conditions such as high temperature, high humidity, or both can lead to corrosion and leaking of the bond agent thus losing the hermeticity of the cavity.

Accordingly, there remains a need for a method of manufacturing an apparatus with sealed cavity that provides even higher level of protection against adverse environmental conditions.

SUMMARY

The need is met by the present invention. In one embodiment of the present invention, an apparatus including a device chip and a cap is disclosed. The device chip includes substrate and at least one circuit element fabricated on the substrate. The cap is bonded to the device chip such that the device chip and the cap define a hermetically sealed cavity where the cavity is sealed with bonding agent and caulking agent.

In another embodiment of the present invention, a method of manufacturing an apparatus is disclosed. A device chip including a substrate and at least one circuit element on the substrate is fabricated. A cap is fabricated. Next, the device chip and the cap are bonded such that a sealed cavity is formed by the device chip and the cap. Then, caulking agent is reflowed to further seal the cavity.

Other aspects and advantages of the present invention will become apparent from the following detailed description, taken in conjunction with the accompanying drawings, illustrating by way of example the principles of the invention.

DETAILED DESCRIPTION

The present invention will now be described with reference to FIGS. 1 through 3C which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "over" relative to other structures, portions, or both. As will be appreciated by those of skill in the art, relative terms and phrases such as "above" or "over" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "over" other structures or portions would now be oriented "below," "under," "left of," "right of," "in front of," or "behind" the other structures or portions.

As shown in the Figures for the purposes of illustration, embodiments of the present invention are exemplified by an apparatus having a device chip and a cap bonded to the device chip, the device chip and the cap defining a sealed cavity. The cavity is sealed with bonding agent and with caulking agent to reinforce the seal thus providing even higher level of protection against adverse environmental conditions.

Figure 1:
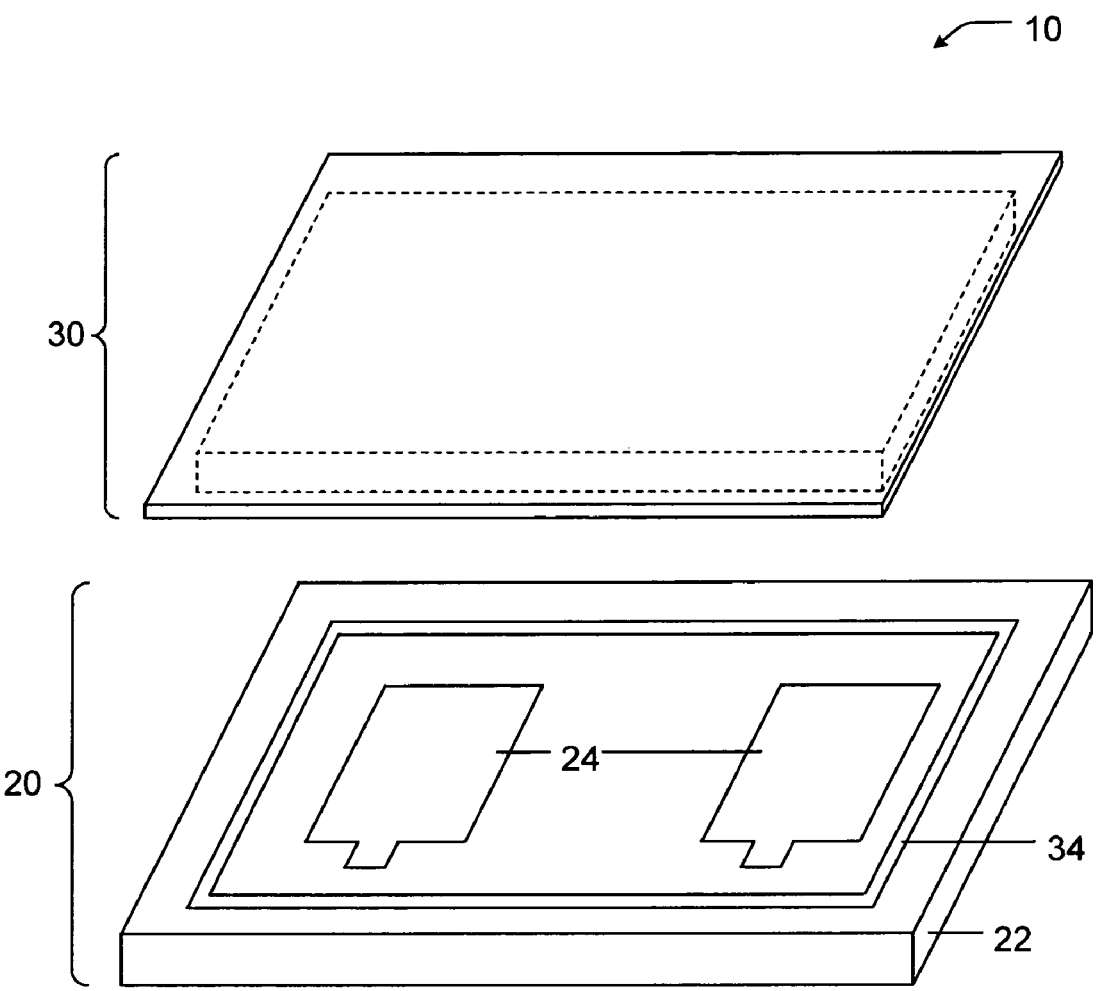
FIG. 1 is a perspective illustration of a sample apparatus.
Figure 2:
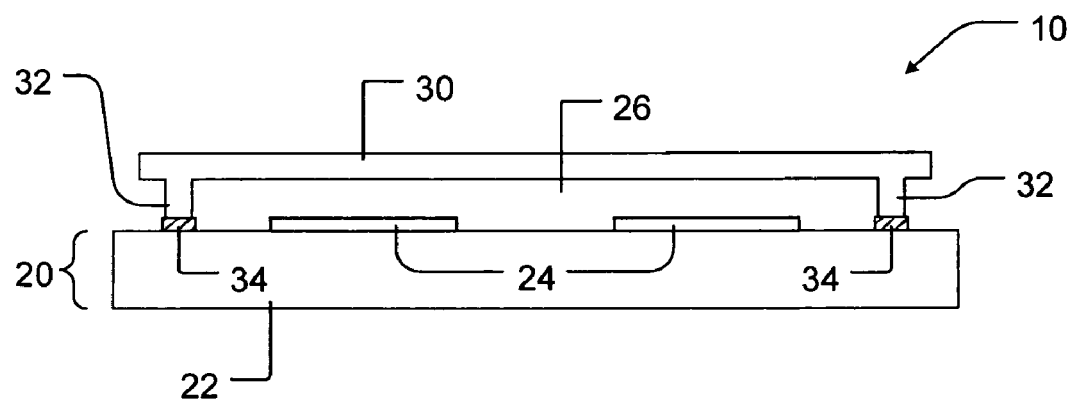
FIG. 2 is a cut-away side view of the apparatus of FIG. 1 following a bonding process.
Figure 3A:
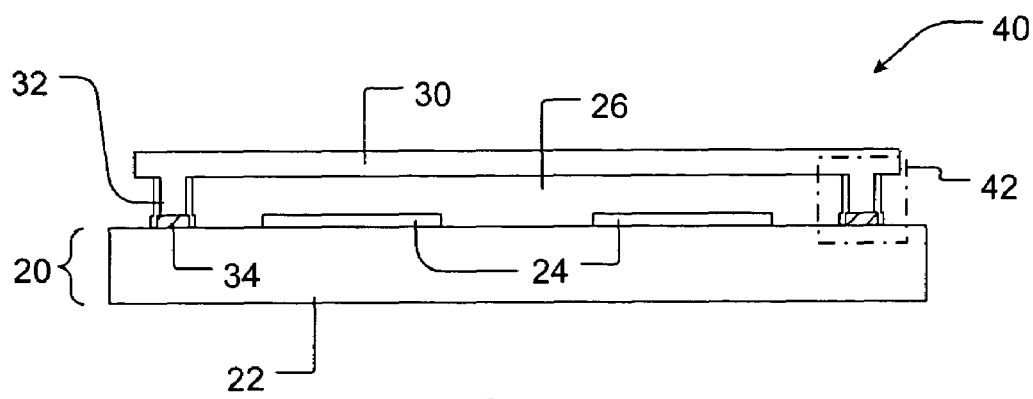
FIG. 3A is a cut-away side view of a apparatus according to one embodiment of the present invention.

FIG. 3A is a cut-away side view of an apparatus 40 according to one embodiment of the present invention. A portion 42 of FIG. 3A is illustrated in more detail in FIGS. 3B and 3C. The apparatus 40 of FIGS. 3A through 3C includes portions similar to corresponding portions of the apparatus 10 of FIGS. 1 and 2. For convenience, portions of the apparatus 40 of FIGS. 3A through 3C that are similar to corresponding portions of the apparatus 10 of FIGS. 1 and 2 are assigned the same reference numerals; different portions are assigned different reference numerals.

Figure 3B:
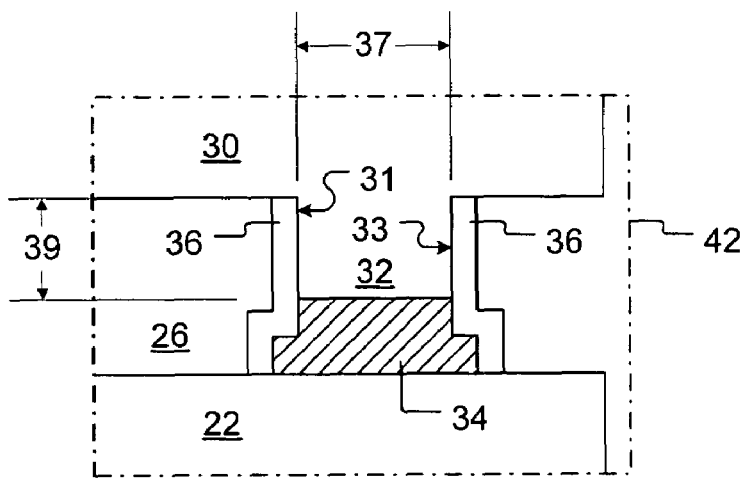
FIG. 3B is a portion of cut-away side view the apparatus of FIG. 3A in more detail.

Referring to FIGS. 3A and 3B, the apparatus 40 includes a device chip 20 including substrate 22 and at least one circuit element 24 fabricated on the substrate 22. The substrate 22 can be, for example, a silicon substrate 22. The circuit element 24 can be, for example, resonators, transistors, or connectors.

A cap 30, including gasket 32, is bonded to the device chip 20 such that the device chip 20 and the cap 30 define a hermetically sealed cavity 26. As illustrated, bottom of the hermetically sealed cavity 26 is defined by the device chip 20 including the substrate 22 and the circuit elements 24. Top of the hermetically sealed cavity 26 is defined by the cap 30. The sizes of the device chip 20 and the cap 30 are on the order of millimeters or fraction of millimeters. Sides of the hermetically sealed cavity 26 are defined by the gasket 32 which can be a part of the cap 30. Depending on the desired application, the gasket 32 can have thickness 37 in the order of microns or tens of microns and have a length 39 in the order of microns or tens of microns. Again, these ranges are examples only. The sizes of these portions can vary widely outside the stated ranges depending on the desired implementation.

The gasket 32 is attached to the substrate 22 using bonding agent 34 such as gold. To achieve the hermetically sealed cavity 26, the bonding agent 34 is applied to the substrate 22, the gasket 32, or both before they are brought together. As for the bonding metal 34, gold (chemical symbol Au) is often used. Then, the device chip 20 and the cap 30 are pressed together and heated to effectuate diffusion bonding. This technique is also known as thermo compression bonding. This process results in a hermetic sealing of the cavity 26.

Here, in addition to the bonding agent 34, caulking agent 36 is used to seal the cavity 26. The bonding agent 34 is thermo compressed at a temperature, "bonding temperature" that depends on the bonding agent material. For gold, a bonding temperature of ranging between, for example, approximately 600 to 670 degrees Kevin but this range can vary greatly depending on material, pressure, and time. Various materials can be used as the caulking agent 36, for example, amorphous fluorocarbon polymer such as Cytop®, polyimide materials, and benzocyclobutene (BCB) based materials. It is desirable that the caulking agent 36 has dispense and patterning properties that are compatible with the rest of the wafer manufacturing process. For example, the caulking agent and the process for depositing caulking agents should not have adverse reactions or impact against other parts of the circuit.

For example, it is desirable that the caulking agent 36 has a reflow temperature that is compatible with the rest of the bonding process. If the reflow temperature is too low, then the caulking agent 36 may not caulk the gasket 32, but rather flow throughout the die or adversely penetrate the bonding agent. If the reflow temperature is too high, then the caulking agent 36 will not flow and caulking will not occur. Additionally, the caulking agent 36 should not include material that adversely affects the device chip 20, its circuits 24, or the cap 30.

As illustrated in FIGS. 3A and 3B, the caulking agent 36 caulks and envelopes portions of or all of the bonding agent 34 and the gasket 32 which is a part of the cap 30. The gasket 32 has an inner surface 31 and an outer surface 33 where the inner surface 31 is exposed to the cavity 26. The caulking agent 36 can be used to caulk the inner surface 31, the outer surface 33, or both. Only one layer of the caulking agent 36 is illustrated for simplicity. However, depending on the application, two or more layers of the caulking agent 36 can be used where the layers can be different caulking material relative to the other layers or multiple layers of the same caulking material.

Figure 3C:
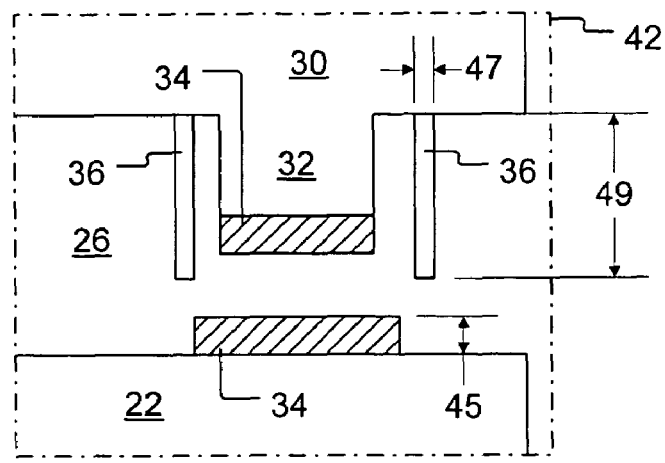
FIG. 3C is the portion illustrated in FIG. 3B prior to a bonding step.

To manufacture the apparatus 40, the device chip 20 is fabricated including the substrate 22 and at least one circuit element 24 on the substrate. Also, the cap 30 is fabricated. The bonding agent 34 can be applied to or fabricated on the device chip 20, the cap 30, or both when these are fabricated. Likewise, the caulking agent 36 can be applied to or fabricated on the device chip 20, the cap 30, or both when these are fabricated. FIG. 3C illustrates the portion 42 before the cap 30 is bonded to the device chip 20.

In the illustrated embodiment, the bonding agent 34 is deposited on both the device chip 20 and the cap 30, but the caulking agent 36 is fabricated on the cap 30 only. The bonding agent 34 is deposited with a thickness 45 in the order of microns in the present embodiment, but this can vary with the different processes. The caulking agent 36 is deposited with a thickness 47 in the order of microns or tens of microns and sufficient length 49 to cover the length of the gasket 32 including the bonding agent 34. For example, the length 49 can be in a range of approximately microns to tens of microns.

Next, the cap 30 is attached to the device chip 20 using thermo compression technique to result in diffusion bonding of the bonding agent 34. At the same time, the bonding temperature causes the caulking agent 36 to reflow to further seal the cavity 26. The reflow step can be performed before or after the diffusion bonding of the bonding agent 34 if needed. In the illustrated embodiment, the bonding process, including the reflow step, is effectuated between approximately 600 to 670 degrees Kevin but this range can vary greatly depending on material, pressure, and time. Pressure, in the illustrated embodiment, is within a range of approximately 15 to 60 mega pascals of localized pressure at the bond interface. For the present example, the bonding temperature and the bonding pressure are applied in the range of minutes and tens of minutes. Again, all these values (temperatures, pressure, and time) can vary greatly depending on many factors including, for example, the material, size, and the process technology as well as the time-temperature-pressure relationship.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A hermetically sealed integrated circuit package, comprising:

an integrated circuit comprising a substrate having an upper surface, a perimeter being disposed upon the upper surface and defining a hermetically sealed portion therewithin, at least one circuit element being disposed within the hermetically sealed portion;

a hermetic cap comprising a top member and a gasket, the cap being configured to cover the hermetically sealed portion and form a hermetically sealed cavity thereover, the gasket comprising opposing first inner and first outer vertical sidewalls depending downwardly from the cap, the sidewalls terminating in and being separated by a bottom edge;

a bonding agent disposed between and engaging the substrate and the bottom edge to form a hermetic seal between the cap and the substrate and thereby hermetically seal the cavity, the bonding agent further comprising opposing second inner and second outer sidewalls disposed between the substrate and the gasket, the second inner sidewall being located within the hermetically sealed porton, the second outer sidewall being located outside the hermetically sealed portion, and a caulking agent disposed along and engaging the first inner and outer vertical sidewalls and the second inner sidewall and the second outer sidewall such that the caulking agent extends between and covers substantially all of and is directly in contact with the first inner and outer vertical sidewalls and the second inner sidewall and the second outer sidewall, the caulking agent extending between the substrate and the top member and being configured to seal the cavity and improve the hermeticity of the hermetic seal formed by the bonding agent.

2. The hermetically sealed integrated circuit package of claim 1, wherein the caulking agent comprises multiple layers of caulking material.

3. The hermetically sealed integrated circuit package of claim 1, wherein the bonding agent comprises gold.

4. The hermetically sealed integrated circuit package of claim 1, wherein the caulking agent comprises at least one of an amorphous fluorocarbon polymer, a polyimide material, and a benzocyclobutene-based material.

5. The hermetically sealed integrated circuit package of claim 1, wherein a thickness of the gasket between the first inner sidewall and the first outer sidewall ranges between about 1 micron and about 10 microns.

6. The hermetically sealed integrated circuit package of claim 1, wherein the at least one circuit element comprises at least one of a resonator, a transistor and a connector.

7. The hermetically sealed integrated circuit package of claim 1, wherein the substrate comprises silicon.

* * * * *